United States Patent
Zhang et al.

(10) Patent No.: US 7,226,820 B2
(45) Date of Patent: Jun. 5, 2007

(54) TRANSISTOR FABRICATION USING DOUBLE ETCH/REFILL PROCESS

(75) Inventors: Da Zhang, Austin, TX (US); Jing Liu, Austin, TX (US); Bich-Yen Nguyen, Austin, TX (US); Voon-Yew Thean, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 307 days.

(21) Appl. No.: 11/101,354

(22) Filed: Apr. 7, 2005

(65) Prior Publication Data

US 2006/0228842 A1    Oct. 12, 2006

(51) Int. Cl.
 *H01L 21/00* (2006.01)
(52) U.S. Cl. ............... 438/149; 438/150; 438/162; 438/163; 438/164; 257/E29.26
(58) Field of Classification Search ........ 438/149–150, 438/162–164; 257/E29.26
See application file for complete search history.

(56) References Cited

U.S. PATENT DOCUMENTS 5,908,313 A * 6/1999 Chau et al. ............. 438/299
6,342,421 B1 * 1/2002 Mitani et al. ............ 438/300
6,599,789 B1 * 7/2003 Abbott et al. ............ 438/161
6,605,498 B1   8/2003 Murthy et al.
6,621,131 B2   9/2003 Murthy et al.

* cited by examiner

Primary Examiner—Matthew Smith
Assistant Examiner—Thanh V. Pham

(57) ABSTRACT

A semiconductor fabrication process includes forming a gate electrode (120) overlying a gate dielectric (110) overlying a semiconductor substrate (102). First spacers (124) are formed on sidewalls of the gate electrode (120). First s/d trenches (130) are formed in the substrate (102) using the gate electrode (120) and first spacers (124) as a mask. The first s/d trenches (130) are filled with a first s/d structure (132). Second spacers (140) are formed on the gate electrode (120) sidewalls adjacent the first spacers (124). Second s/d trenches (150) are formed in the substrate (102) using the gate electrode (120) and the second spacers (140) as a mask. The second s/d trenches (150) are filled with a second s/d structure (152). Filling the first and second s/d trenches (130, 150) preferably includes growing the s/d structures using an epitaxial process. The s/d structures (132, 152) may be stress inducing structures such as silicon germanium for PMOS transistors and silicon carbon for NMOS transistors.

20 Claims, 2 Drawing Sheets ate dielectric 110 is a dielectric film preferably having an
TRANSISTOR FABRICATION USING DOUBLE ETCH/REFILL PROCESS

FIELD OF THE INVENTION

The invention is in field of semiconductor fabrication processes and, more specifically, fabrication processes using strained channels.

RELATED ART

Strained channel transistors incorporate materials that create strain when used in conjunction with silicon. Strained channels can exhibit improved carrier mobility for one type of carrier or the other. Improved carrier mobility is generally desirable for device performance.

In one type of conventional strained channel process, a trench is etched in the source/drain (s/d) regions of a transistor. The s/d trench is then filled with a material having a lattice constant that differs from the lattice constant of single crystal silicon. The s/d structure thus creates stress in the surrounding silicon, including the transistor's channel region.

The conventional strained silicon process includes a single trench and fill sequence. For transistors that employ extension regions as well as deep source/drain regions, either the extension regions or the deep s/d regions would have to be formed by ion implantation. Ion implantation inherently produces junctions that are less than abrupt. Abrupt junctions, however, are desirable for reducing parasitic capacitance within the transistor. Accordingly, it would be desirable to implement a fabrication process and a transistor structure in which strained silicon structures are combined with abrupt s/d junctions.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the invention is a semiconductor fabrication process that leverages strained silicon techniques to form abrupt junction s/d structures. The preferred embodiment of the process uses a first trench and fill sequence to form stress inducing s/d extension structures and a second trench and fill sequence to form stress inducing deep s/d structures. The trench and fill sequences include both etching trenches into the substrate using the gate electrode as an etch mask so that the trenches are self aligned to the gate electrode. An epitaxial growth process is then employed to fill the trenches with stress inducing materials depending upon the conductivity type of the transistor. Silicon germanium, for example, may be used as the stress inducing material for PMOS devices.

Figure 1:
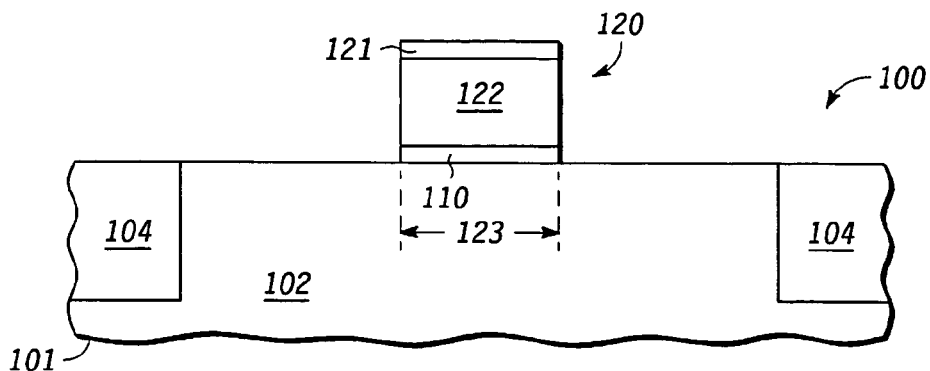
FIG. 1 is a partial cross sectional view of a wafer at an intermediate stage in a semiconductor fabrication process according to one embodiment of the present invention.

Referring now to the drawings, FIG. 1 is a partial cross sectional view of a partially completed integrated circuit 100 formed in a semiconductor fabrication wafer 101. Wafer 101 includes a substrate 102. Substrate 102 is preferably a lightly doped single crystal silicon substrate. The depicted region of substrate 102 may be doped with either an n-type or p-type impurity depending upon the type of transistor to be formed. Wafer 101 may be a silicon on insulator (SOI) wafer in which substrate 102 resides over a buried oxide (BOX) layer and a bulk semiconductor region (neither of which is depicted).

Isolation structures 104 have been formed in substrate 102. Isolation structures 104 provide physical and electrical isolation between adjacent transistors. Isolation structures 104 are preferably comprised of a silicon-oxide compound or another suitable dielectric. The depicted isolation structures are shallow trench isolation (STI) structures, but other implementations may use alternative isolation structures such as LOCOS (local oxidation of silicon) structures that are well known in the semiconductor fabrication field.

A gate electrode structure (gate structure) 120 has been formed overlying substrate 102 on a gate dielectric 110. Gate dielectric 110 is a dielectric film preferably having an effective oxide thickness (EOT) of less than approximately 25 angstroms. Gate dielectric 110 may include a thermally formed silicon dioxide film, one or more high dielectric constant (high K) dielectric films, or a combination thereof. High K dielectric films include various metal oxide, metal silicate, and metal nitride compounds having a dielectric constant that is greater than approximately 10. An exemplary high K dielectric is $HfO_2$.

Gate structure 120 includes an electrically conductive gate electrode 122. Gate electrode 122 may include heavily-doped polycrystalline silicon (polysilicon), a metal or metal compound such as TiN, TaSiN, TaC, W, TiW, Al, and so forth, or a combination polysilicon and one or more metal compounds. An antireflective coating (ARC) layer 121 facilitates precise definition of gate electrode 122 during previous photolithography and etch processing and protects gate electrode 122 during subsequent processing. ARC layer 121 (also referred to as capping layer 121) may be comprised of a dielectric such as silicon nitride. In one embodiment, the capping layer is removed after the gate etching process. In another embodiment, the capping layer is retained until after all s/d etch and filling processes are finished. The figures drawn represent the embodiment in which the capping layer is retained.

As depicted in FIG. 1, a gate etch process has already been performed to define gate electrode 122. The gate etch process is an anisotropic etch process that produces straight and vertically oriented sidewalls. The sidewalls of gate electrode 122 define boundaries of a channel region 123 in substrate 102. As depicted in FIG. 1, the gate etch processing (or processing subsequent thereto) has removed portions of gate dielectric 110 not covered by gate electrode 122.

Figure 2:
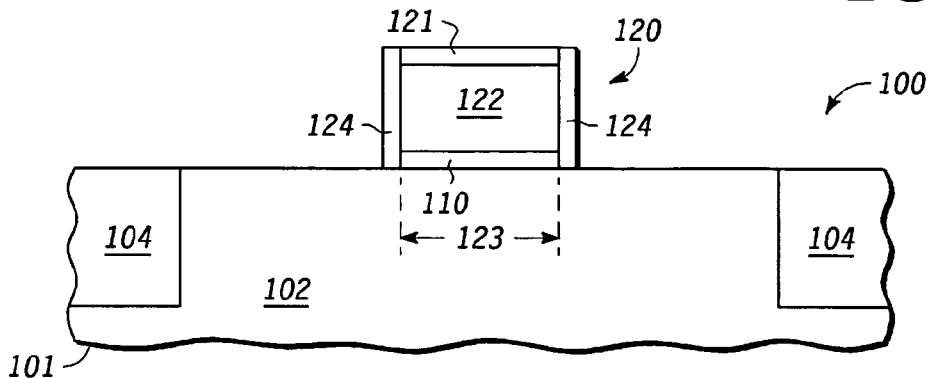
FIG. 2 depicts processing subsequent to FIG. 1 in which "zero" spacers are formed on sidewalls of a gate electrode structure.

Turning now to FIG. 2, thin spacers, referred to herein as zero spacers 124 are formed in sidewalls of gate electrode 122. Preferably, zero spacers 124 are dielectric spacers that are grown or deposited on the gate electrode sidewalls. Zero spacers 124 might be, for example, thermally formed silicon oxide structures on sidewalls of a polysilicon gate electrode. Alternatively, zero spacers 124 may be a deposited dielectric such as silicon oxide, silicon nitride, silicon oxynitride, and so forth. In a preferred embodiment suitable for use in the fabrication of deep submicron transistors (i.e., transistors having a channel region 123 of less than approximately 0.25 microns), zero spacers 124 have a thickness of less than approximately 100 angstroms. Zero spacers 124 insulate and protect the gate dielectric 110 from subsequent soured/drain processing.

Figure 3:
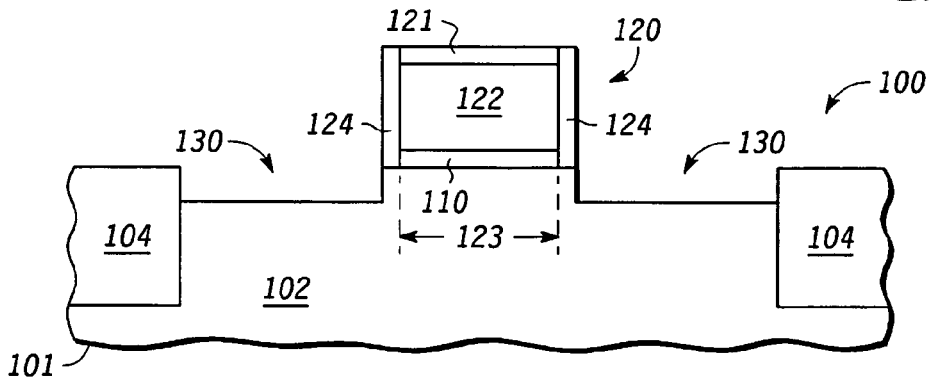
FIG. 3 depicts processing subsequent to FIG. 2 in which an extension trench is formed in the substrate.

Referring now to FIG. 3, trenches 130, referred to herein as extension s/d trenches (extension trenches) 130 are formed using gate structure 120 as a mask such that extension trenches 130 are aligned to gate structure 120. In the preferred embodiment, extension trenches 130 are formed using a silicon dry etch process. Because the gate structure 120 is used as an etch mask during formation of extension trenches 130, the trenches are self aligned to gate structure 130. In one embodiment, a depth of extension structures 130 is approximately 300 angstroms.

Figure 4:
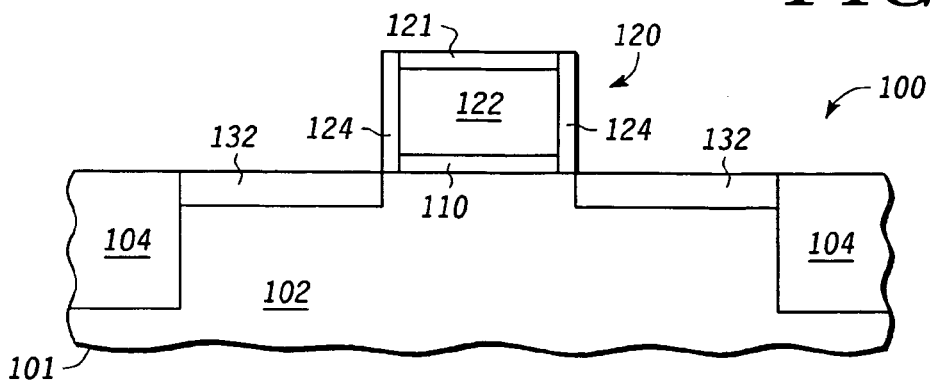
FIG. 4 depicts processing subsequent to FIG. 3 in which the extension trench is filled with an extension structure that creates stress/strain in the transistor channel.

Referring now to FIG. 4, extension trenches 130 are filled with s/d extension structures 132. In the preferred embodiment, s/d extension structures 132 are formed using an epitaxial process. During the epitaxial fill process, the exposed portions of substrate 102 serve as a crystalline seed for the formation of s/d extension structures 132. In the preferred embodiment, s/d extension structures 132 induce stress (either compressive stress or tensile stress) in channel region 123 of substrate 102. For PMOS transistor embodiments, s/d extension structures 132 are preferably boron-doped silicon germanium, which create a compressively stressed channel region 123 desirable for PMOS carriers (holes). For NMOS transistor embodiments, s/d extension structures 132 are preferably arsenic-doped or phosphorus-doped silicon carbon, which create a tensile stressed channel region desirable for NMOS carriers (electrons).

In either embodiment, the doping impurity (boron, arsenic, or other impurity) is introduced in situ during the epitaxial formation of the extension structures. In situ doping of the epitaxial structures eliminates the need to implant an impurity distribution into the structures. Whereas ion implanted impurity distribution exhibit graded junctions due to the probabilistic distribution of implanted species, in situ doped epitaxial structures create precise and abrupt junctions with substrate 102. Precise junctions reduce parasitic capacitances that degrade device performance.

Figure 5:
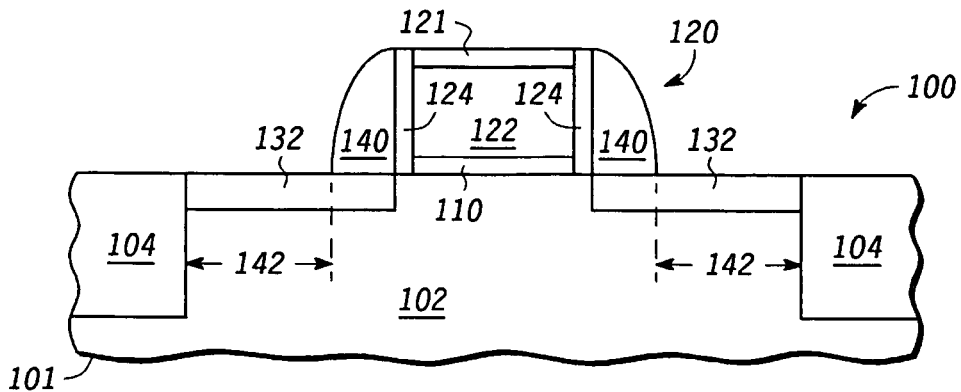
FIG. 5 depicts processing subsequent to FIG. 4 in which offset spacers are formed on the gate electrode sidewalls.

Referring now to FIG. 5, offset spacers 140 are formed on sidewalls of gate structure 120 adjacent the zero spacers 124. In one embodiment, zero spacers 124 and offset spacers 140 are silicon nitride spacers. Offset spacers 140 are formed in a conventional manner by depositing a conformal silicon nitride film followed and subsequently etching the conformal film anisotropically. Offset spacers 140 define boundaries of deep s/d drain regions in substrate 102, as indicated by reference numeral 142. In one embodiment, the thickness of offset spacers 140 is approximately 500 angstroms.

Figure 6:
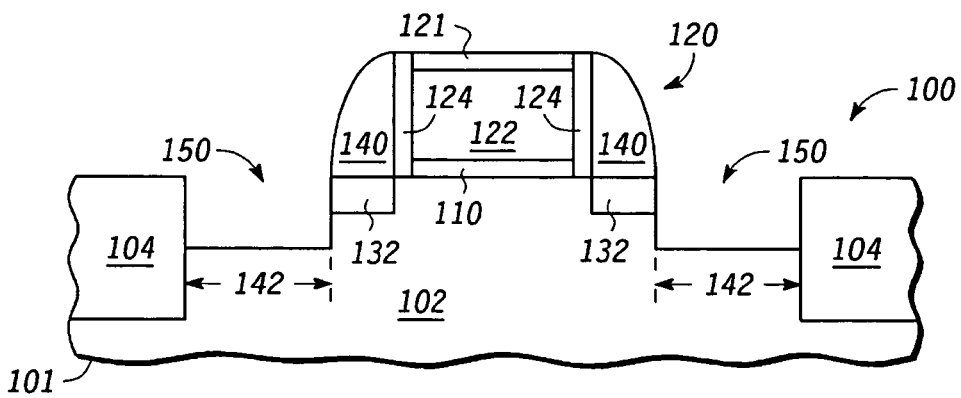
FIG. 6 depicts processing subsequent to FIG. 5 in which a deep s/d trench is formed in the semiconductor substrate.

Referring now to FIG. 6, deep s/d trenches 150 are etched into the deep s/d regions defined by boundaries 142 of substrate 102. The depth of deep s/d trenches 150, as suggested by their name, exceeds the depth of extension structures 132 so that the formation of deep s/d trenches 150 removes portions of extension structures 132. The depth of deep s/d trenches 150 is in the range of approximately 700 angstroms.

Figure 7:
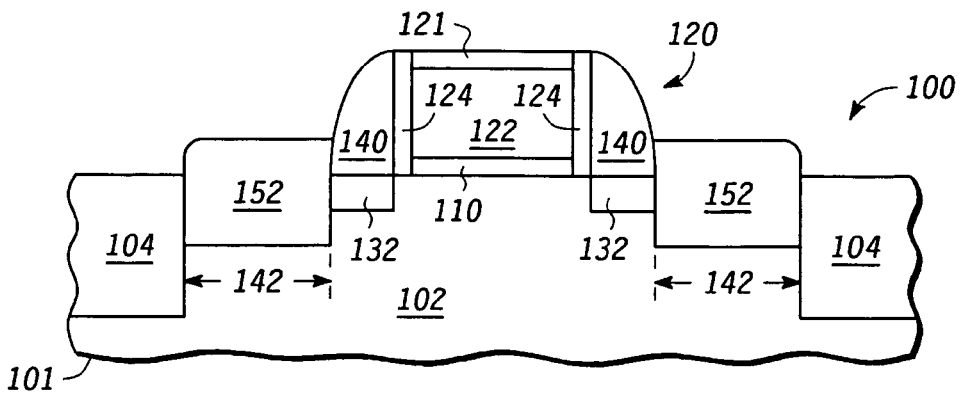
FIG. 7 depicts processing subsequent to FIG. 6 in which the deep s/d trench is filled with a s/d structure.

Referring now to FIG. 7, deep s/d trenches 150 are filled to form deep s/d structures 152. In the preferred embodiment, deep s/d trenches 150 are filled with an epitaxial process similar to the process used to form s/d extension structures 132. In the depicted embodiment, the epitaxial process is continued until an upper surface of deep s/d structures 152 is displaced above the interface between gate dielectric 110 and the underlying substrate 102. In addition to enabling control over the relative concentration of impurities in the extension structures 132 and the deep s/d structures 152, the compositions of the epitaxial films may also differ between the extension structures and the deep s/d structures. Thus, for example, the SiGe in a PMOS embodiment of s/d extension structures 132 may have a composition of $Si_{(1-U)}Ge_U$ while deep s/d structures 152 have a composition of $Si_{(1-V)}Ge_V$ where U and V differ. The ability to control the compositions of the s/d structures and the relative doping of those structures enables optimization of the process to achieve the desired stress induced within the channel region defined by boundaries 123. Moreover, the use of epitaxially formed structures for the s/d extension structures as well as the deep s/d structures creates deep and abrupt junctions. Such deep and abrupt junctions are not attainable using conventional ion implantation processing.

In the foregoing specification, the invention has been described with reference to specific embodiments. However, one of ordinary skill in the art appreciates that various modifications and changes can be made without departing from the scope of the present invention as set forth in the claims below. For example, although gate structure 120 is depicted as a single gate structure, the invention encompasses a floating gate transistor implementation as well. The composition of various structures including isolation structures 104, gate electrode 122, gate dielectric 110, ARC 121, zero spacers 124, and offset spacers 140 may all be different from the disclosed compositions. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:
1. A semiconductor fabrication process, comprising:
forming a gate electrode overlying a gate dielectric overlying a semiconductor substrate;
forming first spacers on sidewalls of the gate electrode;
using the gate electrode and the first spacers as a mask, forming first s/d trenches in the substrate;

filling the first s/d trenches with a first s/d structure, wherein the first s/d structure has a first concentration of a first impurity;

forming second spacers on the gate electrode sidewalls adjacent the first spacers;

using the gate electrode and the second spacers as a mask, forming second s/d trenches in the substrate; and filling the second s/d trenches with a second s/d structure, where the second s/d structure includes a second concentration of a second impurity.

2. The method of claim 1, wherein forming the first s/d trenches comprises etching the semiconductor substrate with self-aligned gate masking.

3. The method of claim 1, wherein filling the first s/d trenches comprises filling the first s/d trenches with use of a first s/d epitaxial growth process.

4. The method of claim 3, wherein the first s/d epitaxial growth process forms a stress inducing first s/d structure.

5. The method of claim 4, wherein the stress inducing s/d structure comprises a compound selected from the group consisting of silicon germanium and silicon carbon.

6. The method of claim 3, wherein filling the second s/d trenches comprises filling the second s/d trenches with use of a second epitaxial s/d growth process.

7. The method of claim 6, wherein the second s/d structure comprises a second stress inducing s/d structure, wherein an impurity concentration of the second stress inducing s/d structure is different than an impurity concentration of the first s/d structure.

8. The method of claim 1, wherein forming the first spacers comprises forming silicon nitride spacers having a thickness of less than or equal to approximately 100 angstroms.

9. The method of claim 8, wherein forming the second spacers comprise forming silicon nitride spacers having a thickness of less than or equal to approximately 100 to 900 angstroms.

10. An integrated circuit, comprising:
a gate electrode overlying a gate dielectric overlying a semiconductor substrate;
a stress inducing extension s/d structure in the semiconductor substrate and aligned to sidewalls of the gate electrode, the extension s/d having a first depth and a first impurity concentration; and
a stress inducing deep s/d structure adjacent the stress inducing extension s/d structure in the semiconductor substrate and aligned to offset spacers on sidewalls of the gate electrode, the deep s/d structure having a second depth, greater than the first depth, and a second impurity concentration, greater than the first impurity concentration.

11. The integrated circuit of claim 10, wherein further comprising, first gate electrode spacers, positioned between the offset spacers and the gate electrode sidewalls.

12. The integrated circuit of claim 11, wherein the first spacers have a thickness less than or equal to approximately 80 angstroms.

13. The integrated circuit of claim 10, wherein the stress inducing extension s/d structure and the stress inducing deep s/d structures comprise a material selected from silicon germanium and silicon carbon.

14. The integrated circuit of claim 13, wherein the stress inducing extension s/d structures and the stress inducing deep s/d structures comprise epitaxial stress inducing structures.

15. A semiconductor fabrication process, comprising:
forming a gate electrode overlying a gate dielectric overlying a silicon substrate;
forming an epitaxial extension s/d structure in the silicon substrate aligned to the gate electrode, wherein a lattice constant of the extension s/d structure is different than the lattice constant of silicon; and
forming an epitaxial deep s/d structure in the silicon substrate aligned to offset spacers adjacent sidewalls of the gate electrode, wherein a lattice constant of the deep s/d structures is different than the lattice constant of silicon.

16. The method of claim 15, wherein the gate electrode is characterized as a PMOS transistor gate electrode and wherein the extension and deep s/d structures comprise epitaxial silicon germanium.

17. The method of claim 16, wherein the extension s/d structure includes a first concentration of boron and the deep s/d structure includes a second concentration of boron, wherein the second concentration is different than the first concentration.

18. The method of claim 15, wherein the gate electrode is characterized as an NMOS transistor gate electrode and wherein the extension and deep s/d structures comprise epitaxial silicon carbon.

19. The method of claim 18, wherein the extension s/d structure includes a first concentration of arsenic and the deep s/d structure includes a second concentration of arsenic, wherein the second concentration is different than the first concentration.

20. The method of claim 15, further comprising, prior to forming the extension s/d structures, forming zero spacers on sidewalls of the gate electrode, wherein the zero spacers have a thickness of less than or equal to approximately 100 angstroms.

* * * * *